United States Patent [19]
Hwang et al.

[11] Patent Number: 6,162,695
[45] Date of Patent: Dec. 19, 2000

[54] FIELD RING TO IMPROVE THE BREAKDOWN VOLTAGE FOR A HIGH VOLTAGE BIPOLAR DEVICE

[75] Inventors: Jei-Feng Hwang, Chu-Pei; Jun-Lin Tsai, Hsin-Chu; Ruey-Hsin Liou, Hsin-Chu; Kuo-Chio Liu, Hsin-Chu, all of Taiwan

[73] Assignee: Taiwan Semiconductor Manufacturing Company, Hsin-Chu, Taiwan

[21] Appl. No.: 09/376,428

[22] Filed: Aug. 18, 1999

[51] Int. Cl.[7] ............... H01L 21/331; H01L 21/8222
[52] U.S. Cl. ............... 438/309; 438/324; 438/325
[58] Field of Search ............... 438/324, 325, 438/309

[56] References Cited

U.S. PATENT DOCUMENTS

| | | | |
|---|---|---|---|
| 4,038,680 | 7/1977 | Yagi et al. | 257/555 |
| 4,966,858 | 10/1990 | Masquelier et al. | 438/294 |
| 5,175,606 | 12/1992 | Tsai et al. | 257/370 |
| 5,179,036 | 1/1993 | Matsumoto | 438/203 |
| 5,274,267 | 12/1993 | Moksvold | 257/592 |
| 5,276,339 | 1/1994 | Fujishima | 257/127 |
| 5,455,189 | 10/1995 | Grubisich | 438/207 |
| 5,856,003 | 1/1999 | Chiu | 438/362 |

*Primary Examiner*—Amir Zarabian
*Assistant Examiner*—Christian D. Wilson
*Attorney, Agent, or Firm*—George O. Saile; Stephen B. Ackerman

[57] ABSTRACT

A method for fabricating a buried layer pinched collector bipolar, (BPCB), device, sharing several process steps with simultaneously formed CMOS devices, has been developed. The BPCB device fabrication sequence features the use of field ring regions, placed in an N well region, and located between a base and collector region. The use of the field ring results in an increase in collector-emitter breakdown voltage, as a result of the reduction in local dopant concentration in the N well region. This phenomena, the reduction the local dopant concentration in the N well region, in the vicinity of the field ring region, allows a higher N well dopant concentration to be used, resulting in increased frequency responses, (Ft), of the BPCB device, when compared to counterparts fabricated without the field ring regions, and thus with a lower N well dopant concentration.

15 Claims, 5 Drawing Sheets

6,162,695

FIELD RING TO IMPROVE THE BREAKDOWN VOLTAGE FOR A HIGH VOLTAGE BIPOLAR DEVICE

BACKGROUND OF THE INVENTION (1) Field of the Invention

The present invention relates to methods used to fabricate semiconductor devices, and more specifically to a method used to increase the collector-emitter breakdown voltage of a Buried layer Pinched Collector Bipolar, (BPCB), device.

(2) Description of Prior Art

The addition of bipolar devices, to designs comprised with complimentary metal oxide semiconductor, (CMOS), devices, have allowed the performance of these BiCMOS, semiconductor chips, in terms of switching speeds, or frequency response, (Ft), to be increased when compared to counterpart designs, comprised with only CMOS devices. In addition the complexity of fabricating a BiCMOS chip, is reduced by also using, or sharing, several CMOS fabrication sequences, for the construction of the bipolar devices. For example an NPN bipolar device, featuring a N type, buried subcollector region, fabricated simultaneously with CMOS devices, can result in an Ft of about 5 to 20 Ghz, with a collector-emitter breakdown voltage, (BVCEO), of about 8 to 10 volts. The use of a P type, buried layer, in place of the N type, buried subcollector, results in an increase in BVCEO to about 20 volts, however at the expense of Ft which now is less than 5 Ghz, due to a lower than desired N well concentration, used to obtain the BVCEO increases.

This invention will describe a bipolar device fabrication procedure, blended together with the fabrication of CMOS devices, in which the bipolar device, of the BiCMOS chip, is fabricated featuring a P type field ring, located underlying a field oxide region, and between the base and collector regions of the bipolar device. The use of the P type field ring increases the BVCEO parameter, while allowing the use of heavier N well concentrations, thus resulting in increases in Ft to be realized. The BVceo increase resulted from a reduction in the local dopant concentration of the N well region, as a result of the P type field ring region, allowing BVCEO values of about 90 volts to be realized. Prior art, such as Chi, in U.S. Pat. No. 5,866,003, as well as Miscaller et al, in U.S. Pat. No. 4,966,858, describe buried layers for a bipolar device, and polysilicon field plates for a lateral bipolar device, however these prior arts do not suggest the use of field ring region, located between the base and collector regions, of a bipolar device, fabricated using the same process steps used to fabricate a CMOS device.

SUMMARY OF THE INVENTION

It is an object of this invention to fabricate a buried layer pinched collector bipolar, (BPCB), device, and an a CMOS device, using an integrated fabrication sequence.

It is another object of this invention to increase the collector-base breakdown voltage, of the BPCB, bipolar device, via use of a P type field ring, placed in the N well region, between the base and collector regions.

It is still another object of this invention to increase the Ft of the BPCB bipolar device via an increase in N well dopant concentration.

In accordance with the present invention, a buried layer pinched collector, (BPCB), bipolar device, fabricated simultaneously with CMOS devices, and with the bipolar device featuring a P type field region, used to improve collector-emitter breakdown voltage, and used to improve frequency response of the device, is described. After formation of an P type, buried layer region, in a semiconductor substrate, a thick, P type, epitaxial silicon layer is deposited, followed by the creation of an N well region, in an area of the P type, epitaxial silicon layer, to be used for a NPN, BPCB bipolar device. P type field ring regions are next formed, followed by the formation of field oxide regions, overlying the P type, field oxide regions. A P type base region is next formed in an area of the N well region, between field oxide regions, and between the P type, field ring regions. An N type region is then formed in a portion of the P type base region, to be used as an emitter region, while additional N type regions are formed in areas of the N well region, to be used as collector regions. The P type, field ring regions, located in the N well region, between the P type, base region, and the collector regions, allow higher voltage collector-emitter breakdowns to occur, while allowing a higher N well concentration to be used, resulting in increased device frequency response.

BRIEF DESCRIPTION OF THE DRAWINGS

The object and other advantages of this invention are best described in the preferred embodiments with reference to the attached drawings which include.

DESCRIPTION OF THE PREFERRED EMBODIMENTS

The method of fabricating a buried layer pinched collector bipolar, (BPCB), device, along with, and sharing process steps with, CMOS devices, featuring field ring regions, used to improve the performance of the BPCB device, will now be described in detail. This invention will be described as an NPN type, bipolar device. However the use of the field ring regions, can also be applied to PNP type, buried layer pinched collector bipolar devices via: the creation of a N type, buried layer; the use of a N type, epitaxial layer; the creation of a P well region, in the N type epitaxial layer; the creation of N type, field ring regions; the creation of an N type base region, in the P well regions; and the creation of a P type emitter region, and P type collector regions.

Figure 1:
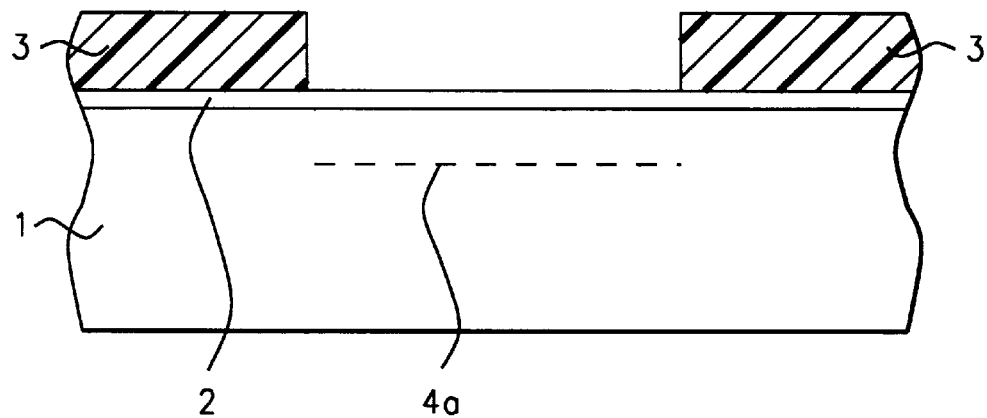
FIGS. 1–9, which schematically, in cross-sectional style, describe the fabrication of a buried layer pinched collector bipolar, (BPCB), device, fabricated along with, and sharing process steps of, CMOS devices, and featuring the use of field ring regions, placed between the base and collector regions of the BPCB device, employed to improve the characteristics of the BPCB device.

A semiconductor substrate 1, comprised of P type, single crystalline silicon, with a <100> crystallographic orientation, is used and schematically shown in FIG. 1. A silicon oxide layer 2, to be used as a screen oxide for a subsequent ion implantation procedure, is thermally grown to a thickness between about 100 to 200 Angstroms. Photoresist shape 3, is then formed, and used as a mask to allow an ion implantation procedure, using boron, or $BF_2$ ions, at an energy between about 30 to 60 KeV, and at a dose between about 2E12 to 6E12 atoms/cm$^2$, to create region 4a, comprised of the implanted P type ions. This is schematically shown in FIG. 1.

Figure 2:
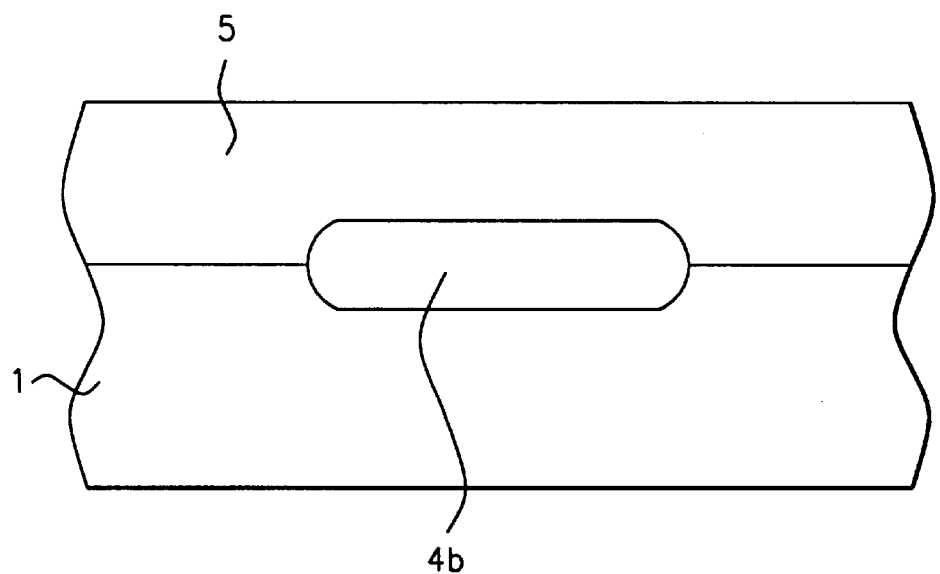

Photoresist shape 3, is then removed via plasma oxygen ashing and wet cleans, followed by the removal of screen oxide layer 2, via the use of a wet, hydrofluoric acid solution. A P type, epitaxial silicon layer 5, is then deposited at a temperature between about 1100 to 1200° C., to a thickness between about 4.4 to 4.6 um, using either silane, disilane, or trichlorosilane as a silicon source, with the addition of diborane, to result in a surface concentration for P type, epitaxial silicon layer 5, between about 1E14 to 5E14 atoms/cm$^3$. The temperature experienced during the growth of P type, epitaxial silicon layer 5, results in the creation of P type buried layer 4b, shown schematically in FIG. 2. P type buried layer 4b, located in a top portion of semiconductor substrate 1, and in a bottom portion of P type, epitaxial silicon layer 5, will improve the collector-emitter breakdown voltages of BPCB devices, but only to a level below about 50 volts, and with a low frequency response, (Ft), as a result of a subsequent, lightly doped N well region. Therefore the remainder of this description will show the introduction of the novel field ring regions, to the BPCB device, allowing higher N well concentrations to be used, resulting in a higher Ft, and allowing collector-emitter breakdown voltages, greater than 90 volts, to be achieved.

Figure 3:
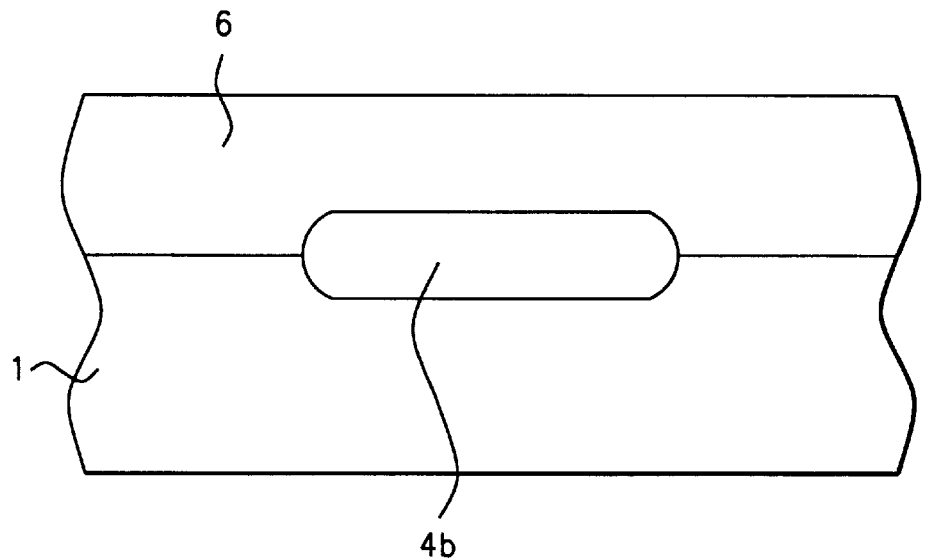

Conventional photolithographic masking procedures are next used to create N well region 6, in semiconductor substrate 1. This is accomplished via an ion implantation procedure, using arsenic, or phosphorous ions, at an energy between about 90 to 110 KeV, and at a dose between about 1E12 to 3E12 atoms/cm$^2$. The photoresist shape, used for definition of N well region 6, shown schematically in FIG. 3, is removed via plasm oxygen ashing and careful wet clean procedures. The activation of the implanted ions, of N well region 6, will be accomplished during the formation of a subsequent field oxide region. N well region 6, with a surface concentration between about 1E16 to 5E16 atoms/cm$^3$, is formed simultaneously with the formation of the N well regions of CMOS devices. In addition N well region 6, is comprised with a higher dopant concentration than counterparts, due to the reduction in the local dopant concentration, in the vicinity of subsequent P type, field ring regions.

Figure 4:
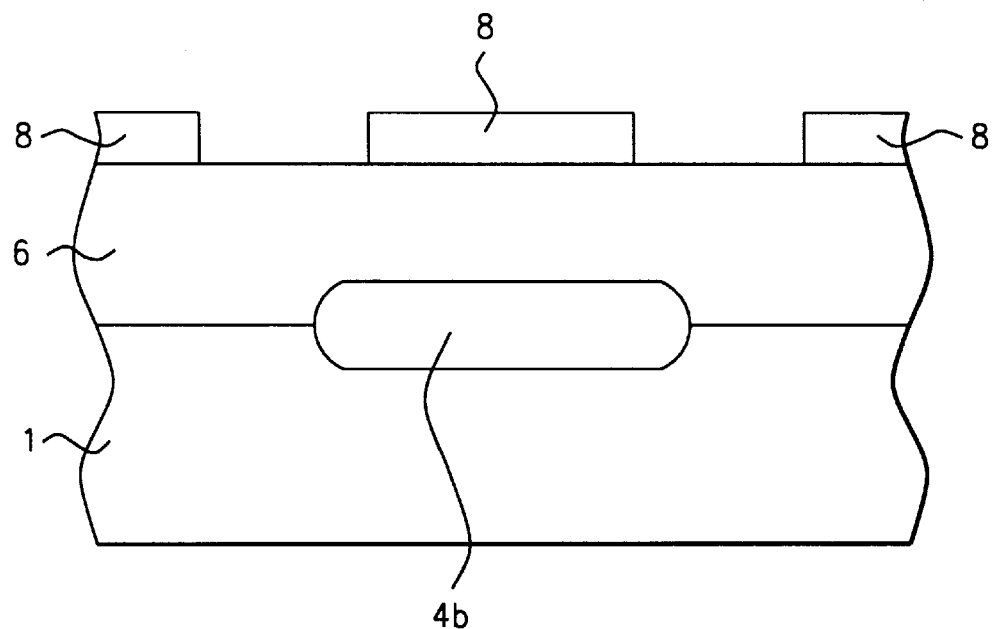

An oxidation resistant shape 8, comprised of silicon nitride is next formed via deposition of a silicon nitride layer, using low pressure chemical vapor deposition, (LPCVD), or plasma enhanced chemical vapor deposition, (PECVD), procedures, at a thickness between about 1000 to 2000 Angstroms, followed by patterning of the silicon nitride layer, via conventional photolithographic and reactive ion etching, (RIE), procedures. Oxidation resistant shape 8, shown schematically in FIG. 4, can also be comprised of a silicon nitride layer, overlying a thin silicon oxide, pad layer. The photoresist shape, used to define oxidation resistant shape 8, is again removed using plasma oxygen ashing and careful wet cleans.

Figure 5:
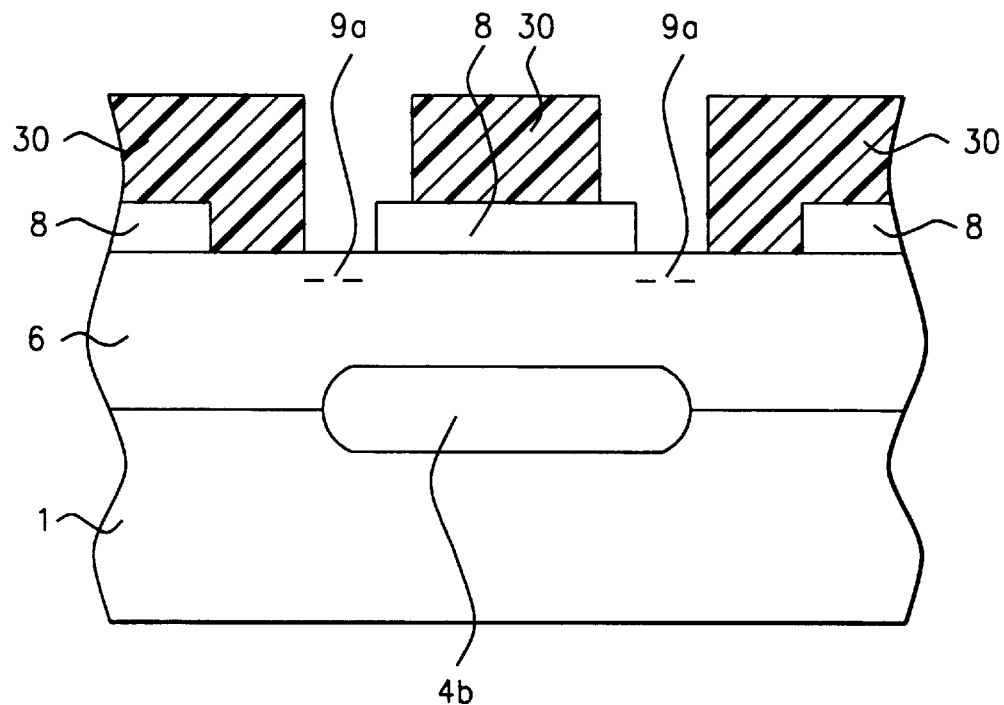
Figure 6:
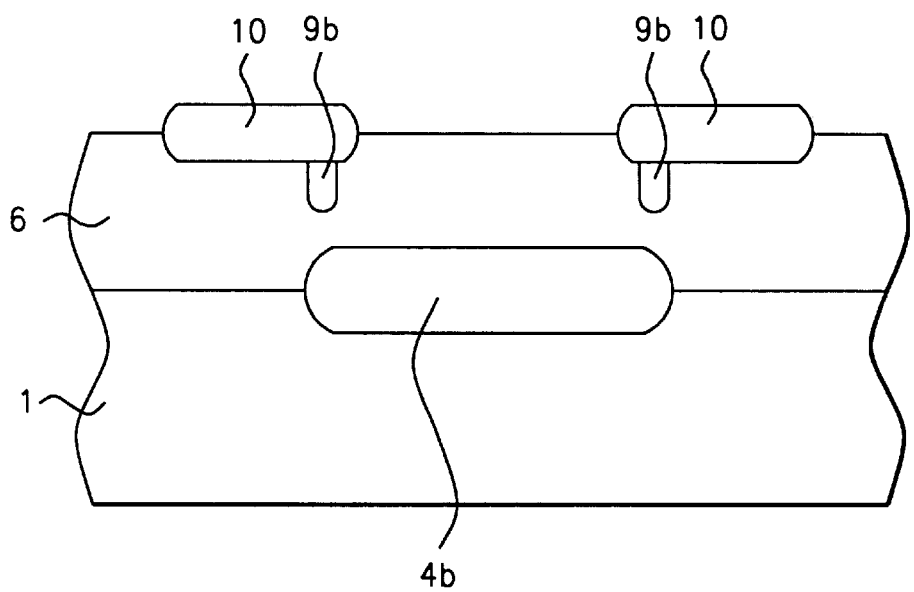

Photoresist shape 30, is now formed and used, along with oxidation resistant shape 8, as a mask, to allow the critical P type ion region 9a, to be used for the subsequent P type field ring regions, to be created in non-masked regions, via ion implantation of boron, or BF$_2$ ions, at an energy between about 20 to 40 KeV, at a dose between about 1E13 to 5E13 atoms/cm$^2$. This is schematically shown in FIG. 5. The ion implantation procedure used to create P type ion region 9a, for the BPCB device, is the same procedure used to create a P well region for the CMOS devices. After removal of photoresist shape 30, via plasma oxygen ashing, and careful wet cleans, a thermal oxidation procedure is performed, in an oxygen-steam ambient, at a temperature between about 950 to 1000° C., creating field oxide, (FOX), regions 10, at a thickness between about 5500 to 6500 Angstroms, in regions of N well region 6, not covered by oxidation resistant shape 8. The temperature experienced during the creation of FOX regions 10, also result in the formation of P type, field ring regions 9b, formed from P type ion region 9a, as well as activating the ions used for N well region 6. This is shown schematically in FIG. 6. The FOX procedure, used for the BPCB device, was also shared with the step used to create the desired isolation regions, for adjacent CMOS devices. Oxidation resistant shape 8, is now selectively removed via use of a hot phosphoric acid solution. If needed, additional P type, field ring regions can be used to enhance the device characteristics of the BPCB device. For example two, P type, field ring regions, underlying a FOX region, can be located between subsequent base and collector regions.

Figure 7:
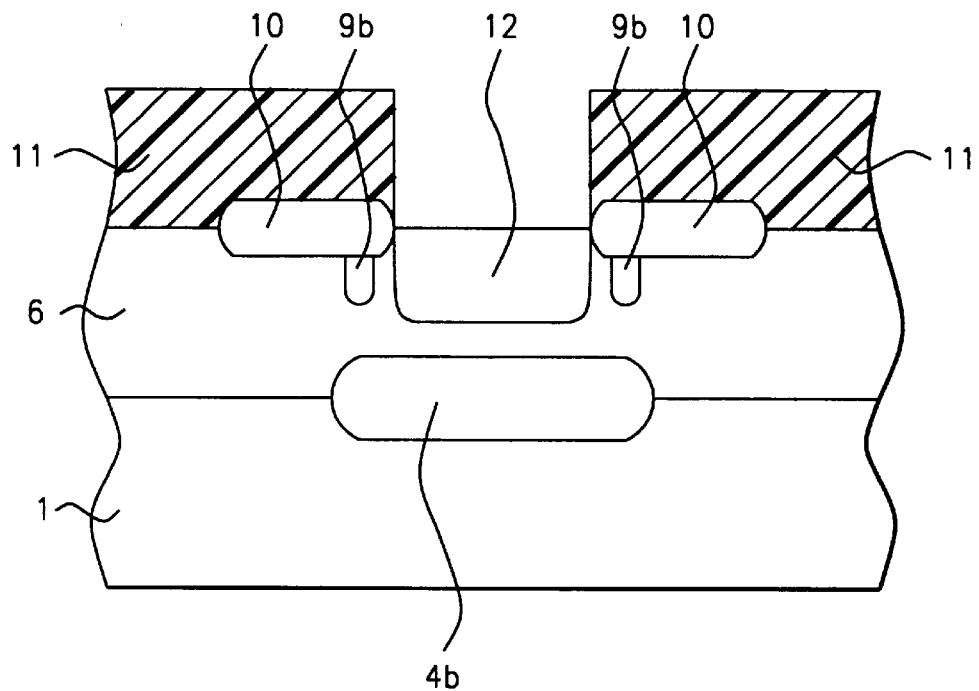
Figure 8:
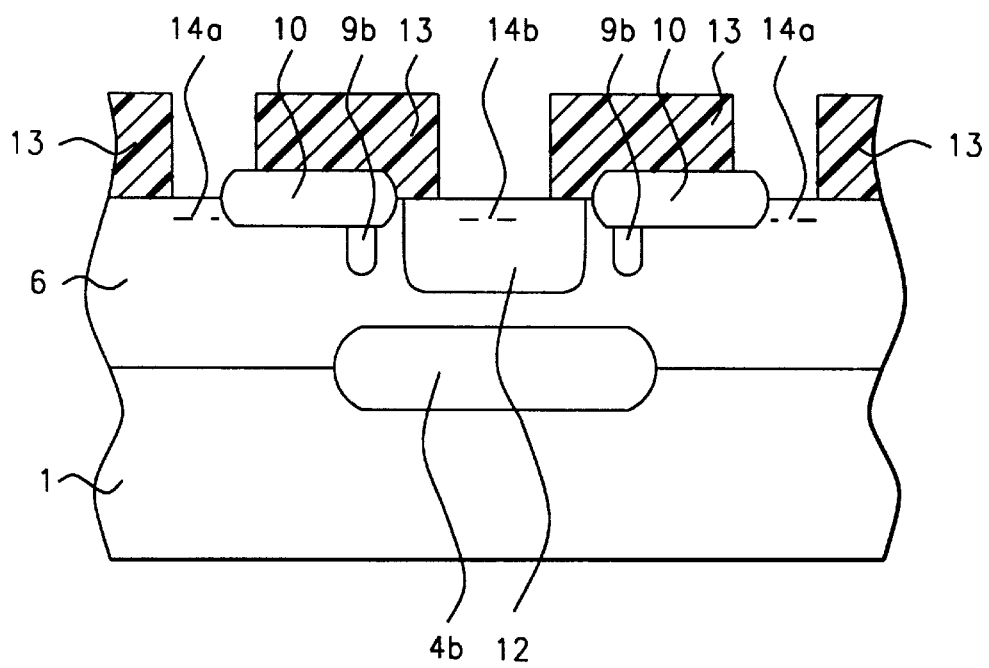

Photoresist shape 11, is next used as a mask to allow an ion implantation procedure, using either boron or BF$_2$ ions, at an energy between about 35 to 45 KeV, at a dose between about 2.0E13 to 2.5E13 atoms/cm$^2$, to create P type, base region 12, schematically shown in FIG. 7. The surface concentration of P type, base region 12, is between about 2.0E16 to 2.5E16 atoms/cm$^3$. Photoresist shape 11, is removed via plasma oxygen ashing and careful wet cleans, followed by the formation of photoresist shape 13, to be used as a mask to define the emitter, and collector regions of the BPCB device. An ion implantation procedure, using arsenic, or phosphorous ions, at an energy between about 50 to 70 KeV, and at a dose between about 6E15 to 7E15 atoms/cm$^2$, is used to create collector ion regions 14a, and emitter ion region 14b. This is schematically shown in FIG. 8. The ion implantation step used to form the heavily doped, source/drain region, for the CMOS devices, can be used to create collector ion regions 14a, and emitter ion region 14b, for the BPCB device.

Figure 9:
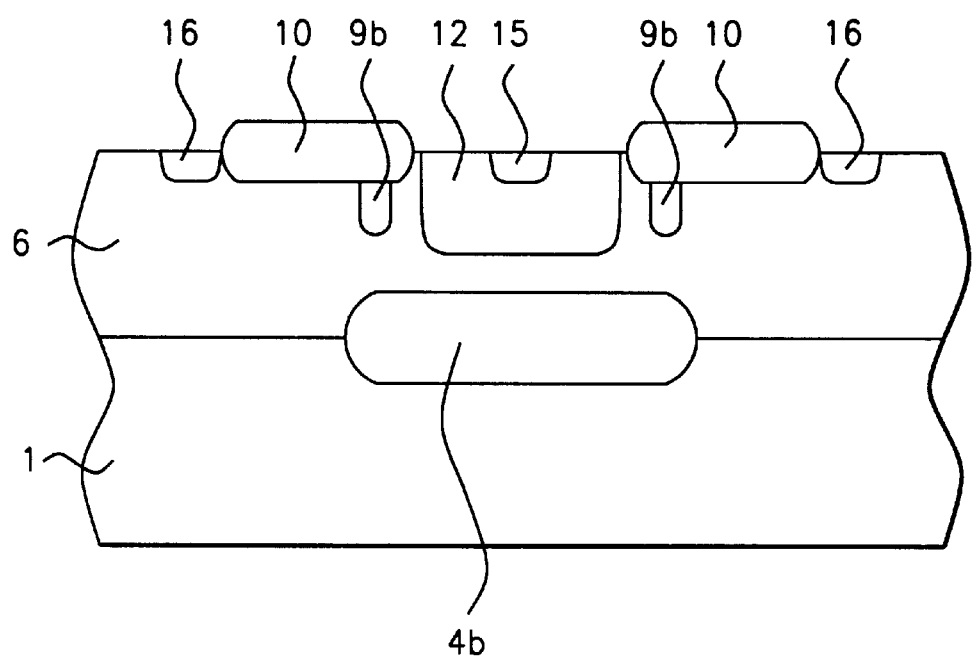

After removal of photoresist shape 13, accomplished again using plasma oxygen ashing and careful wet cleans, an anneal procedure is used to activate the N type ions in collector ion regions 14a, and in emitter ion region 14b, resulting in collector regions 16, and emitter region 15, shown schematically in FIG. 9. The use of the P type, field ring regions, located between P type, base region 12, and collector region 16, allows collector-emitter breakdowns to exceed 90 volts, due to the reduction in the local concentration of the N well region, in the region of the N well between P type base region 12, and collector region 16. However the presence of the higher doped, N well region, in the remaining areas, allow a higher Ft to be achieved, compared to counterparts fabricated in a lower concentration of an N well region. In addition the use of the P type, field ring region allows a space between base and collector regions to be reduced to about 4 um, still however allowing the improved collector-emitter breakdown voltage, and the improved Ft to be realized.

While this invention has been particularly shown and described with reference to, the preferred embodiments thereof, it will be understood by those skilled in the art that various changes in form and details may be made without departing from the spirt and scope of this invention.

What is claimed is:

1. A method of fabricating a buried layer pinched collector bipolar, (BPCB), device, on a semiconductor substrate, comprising the steps of:

forming a buried layer region, in a first portion of said semiconductor substrate;

depositing an epitaxial silicon layer, with a portion of said buried layer region, extending into the bottom portion of said epitaxial silicon layer;

forming a well region, in said epitaxial silicon layer, with said well region overlying said buried layer region;

forming field oxide regions in said semiconductor substrate;

forming field ring regions, in first portions of said well region, underlying said field oxide regions;

forming a base region in a second portion of said well region, located between the inside edges of said field oxide regions, wherein said base region is a P type, base region, formed via an ion implantation procedure using boron, or $BF_2$ ions, at an energy between about 35 to 45 KeV, at a dose between about 2.0E13 to 2.5E13 atoms/$cm^2$;

forming an emitter region, in a top portion of said base region, wherein said emitter region, is an N type emitter region, formed via an ion implantation procedure, using arsenic, or phosphorous ions, at an energy between about 50 to 70 KeV, and at a dose between about 6E15 to 7E15 atoms/$cm^2$; and forming collector regions, in a third portion of said well region, adjacent to the outside edges of said field oxide regions.

2. The method of claim 1, wherein said buried layer region, is a P type, buried layer, formed via an ion implantation procedure, using boron, or $BF_2$ ions, at an energy between about 30 to 60 KeV, at a dose between about 2E12 to 6E12 atoms/$cm^2$.

3. The method of claim 1, wherein said epitaxial silicon layer, is a P type, epitaxial silicon layer, deposited at a temperature between about 1100 to 1200° C., to a thickness between about 4.4 to 4.6 um, using silane, disilane, or trichlorosilane, as a source, with the addition of diborane, to result in a surface concentration between about 1E14 to 5E14 atoms/$cm^3$, for said P type, epitaxial silicon layer.

4. The method of claim 1, wherein said well region, is an N well region, formed via an ion implantation procedure, using arsenic, or phosphorous ions, at an energy between about 90 to 110 KeV, at a dose between about 1E12 to 3E12 atoms/$cm^2$.

5. The method of claim 1, wherein said field ring regions, are P type, field ring regions, formed via an ion implantation procedure, using boron, or $BF_2$ ions, at an energy between about 20 to 40 KeV, at a dose between about 1E13 to 5E13 atoms/$cm^2$.

6. The method of claim 1, wherein said field oxide regions are formed to a thickness between about 5500 to 6500 Angstroms, via a thermal oxidation procedure, performed in an oxygen-steam ambient, at a temperature between about 950 to 1000° C.

7. The method of claim 1, wherein said collector regions are N type collector regions, formed via an ion implantation procedure, using arsenic, or phosphorous ions, at an energy between about 50 to 70 KeV, and at a dose between about 6E15 to 7E15 atoms/$cm^2$.

8. A method of fabricating a buried layer pinched collector bipolar, (BPCB), device, on a semiconductor substrate, using field ring regions, located between a base and collector region, comprising the steps of:

forming a P type, buried layer region in a portion of said semiconductor substrate;

depositing a P type, epitaxial silicon layer, on said semiconductor substrate, with said P type, buried layer region extending into a bottom portion of said P type, epitaxial silicon layer;

forming an N well region in said P type, epitaxial silicon layer, with said N well region overlying and contacting said P type, buried layer region;

forming an oxidation resistant shape on said N well region;

forming P type, field ring regions, in first portions of said N well region;

growing field oxide regions, in areas of said N well region not covered by said oxidation resistant shape, and with said P type, field ring regions, now located underlying said field oxide regions;

selectively removing said oxidation resistant shape;

forming a P type, base region, in a second portion of said N well region, located between inside edges of said field oxide regions, wherein said P type, base region is formed via an ion implantation procedure, using boron, or $BF_2$ ions, at an energy between about 35 to 45 KeV, and at a dose between about 2.0E13 to 2.5E13 atoms/$cm^2$;

forming an N type, emitter region, in a top portion of said P type, base region located between said field oxide regions, wherein said N type, emitter region is formed via an ion implantation procedure, using arsenic, or phosphorous ions, at an energy between about 50 to 70 KeV, and at a dose between about 6E15 to 7E15 atoms/$cm^2$; and forming N type, collector regions, in third portions of said N well region, located adjacent to the outside edges of said field oxide regions.

9. The method of claim 8, wherein said P type, buried layer region is formed via an ion implantation procedure, using boron, or $BF_2$ ions, at an energy between about 30 to 60 KeV, at a dose between about 2E12 to 6E12 atoms/$cm^2$.

10. The method of claim 8, wherein said P type, epitaxial silicon layer is deposited at a temperature between about 1100 to 1200° C., to a thickness between about 4.4 to 4.6 um, using silane, disilane, or trichlorosilane, as a source, with the addition of diborane, resulting in a surface concentration between about 1E14 to 5E14 atoms/$cm^3$ for said P type, epitaxial silicon layer.

11. The method of claim 8, wherein said N well region is formed via an ion implantation procedure using arsenic, or phosphorous ions, at an energy between about 90 to 110 KeV, at a dose between about 1E12 to 3E12 atoms/$cm^2$.

12. The method of claim 8, wherein said oxidation resistant shape is comprised of silicon nitride.

13. The method of claim 8, wherein said P type, field ring regions are formed via an ion implantation procedure, using boron, or $BF_2$ ions, at an energy between about 20 to 40 KeV, and at a dose between about 1E13 to 5E13 atoms/$cm^2$.

14. The method of claim 8, wherein said field oxide regions are formed to a thickness between about 5500 to 6500 Angstroms, via a thermal oxidation procedure, performed in an oxygen-steam ambient, at a temperature between about 950 to 1000° C.

15. The method of claim 8, wherein said N type, collector regions, are formed via an ion implantation procedure, using arsenic, or phosphorous ions, at an energy between about 50 to 70 KeV, and at a dose between about 6E15 to 7E15 atoms/$cm^2$.

* * * * *